United States Patent [19]

Rhieu

[11] Patent Number: 5,364,667
[45] Date of Patent: Nov. 15, 1994

[54] PHOTO-ASSISTED CHEMICAL VAPOR DEPOSITION METHOD

[75] Inventor: Ji H. Rhieu, Mesa, Ariz.

[73] Assignee: Amtech Systems, Inc., Tempe, Ariz.

[21] Appl. No.: 67,286

[22] Filed: May 25, 1993

Related U.S. Application Data

[63] Continuation-in-part of Ser. No. 822,361, Jan. 17, 1992, Pat. No. 5,215,588.

[51] Int. Cl.$^5$ .......................... B05D 3/06; C23C 16/48
[52] U.S. Cl. .................................. 427/582; 427/583; 427/584; 118/715; 118/722
[58] Field of Search ............... 427/582, 583, 584; 118/715, 722

[56] References Cited

U.S. PATENT DOCUMENTS

| | | | |
|---|---|---|---|
| 4,435,445 | 3/1984 | Allred et al. | 427/54.1 |
| 4,556,584 | 12/1985 | Sarkozy | 427/54.1 |
| 4,654,226 | 3/1987 | Jackson et al. | 427/54.1 |
| 4,715,318 | 12/1987 | Kameyama et al. | 118/722 |
| 4,778,693 | 10/1988 | Drozdowicz et al. | 427/53.1 |
| 4,811,684 | 3/1989 | Tashiro et al. | 118/50.1 |
| 4,816,294 | 3/1989 | Tsuo et al. | 427/531 |
| 4,846,102 | 7/1989 | Ozias | 118/715 |
| 4,887,548 | 12/1989 | Urata et al. | 118/722 |
| 4,981,815 | 1/1991 | Kakoschke | 437/173 |
| 5,005,519 | 4/1991 | Egermeier | 118/722 |

FOREIGN PATENT DOCUMENTS

| | | | |
|---|---|---|---|
| 59-3931 | 1/1984 | Japan . | |
| 0075621 | 4/1984 | Japan | 427/582 |
| 0231822 | 12/1984 | Japan | 427/582 |
| 60-245217 | 12/1985 | Japan . | |
| 5-5183 | 1/1993 | Japan | 427/582 |
| 2065973A | 7/1981 | United Kingdom | 437/173 |

*Primary Examiner*—Roy V. King
*Attorney, Agent, or Firm*—Cahill, Sutton & Thomas

[57] ABSTRACT

In a photo-CVD system, ultraviolet light is introduced into a reaction chamber from light emitting elements of ultraviolet light sources, through transparent bulb surfaces thereof, and through elongated light pipes in a sealed wall bounding the reaction chamber. This prevents molecules of reactant gas in the reaction chamber from reaching and being deposited on the transparent bulb surfaces, and thereby prevents buildup of such reactant molecules from occurring and impeding flow of ultraviolet light into the reaction chamber.

2 Claims, 3 Drawing Sheets

PHOTO-ASSISTED CHEMICAL VAPOR DEPOSITION METHOD

CROSS REFERENCE TO RELATED APPLICATION

This application is a continuation-in-part of my commonly assigned patent application "Photo-CVD System", Ser. No. 07/822,361 filed Jan. 17, 1992, which issued as U.S. Pat. No. 5,215,588 on Jun. 1, 1993.

BACKGROUND OF THE INVENTION

The invention relates to techniques for preventing chemical vapor deposition (CVD) reaction chamber windows from becoming clouded, and more particularly to a technique utilizing narrow light pipes to introduce light into the reactant gas.

Chemical vapor deposition processes are well-known and are used extensively in the manufacture of semiconductor integrated circuits. To avoid subjecting semiconductor wafers in CVD processes to high temperatures that may cause various problems such as lateral diffusion of dopants in highly doped region of the integrated circuit, generation of material defects, and generation of undesired stresses in the semiconductor material, various photo-CVD or photo-assisted CVD deposition processes have been developed wherein the substrate is irradiated with ultraviolet (UV) light while it is being heated, allowing significantly lower temperatures to be used.

Photo-assisted CVD processes have not been widely used to date because no practical technique has been developed for preventing clouding of light windows through which the UV light is introduced into the reaction chamber. The chemical reactants are deposited not only on the semiconductor wafers, but also on the walls of the reactant chamber and the light window thereof.

The deposition of the material on the window clouds it, reducing the amount of UV light entering from one process to the next, and also producing unacceptable non-uniformity in the deposition of oxide layers, nitride layers, and the like on the semiconductor wafers. This results in reduced integrated circuit yields.

Various prior techniques have been used to reduce deposition of material from reactant gases on the window through which UV light is introduced. U.S. Pat. Nos. 4,435,445, 4,556,584, 4,654,226, 4,715,318, 4,778,693, 4,811,684, 4,816,294, 5,005,519 are generally indicative of the state-of-the-art.

There is an unmet need for a practical, economical system for preventing appreciable deposition of material from reactant gases in a photo CVD reaction chamber on the surface of a transparent window thereof through which light is introduced into the reaction chamber.

SUMMARY OF THE INVENTION

It is an object of the invention to provide an apparatus and method for preventing deposition of material from reactant gas in a photo CVD chamber on a window through which light is introduced into the reaction chamber.

It is another object of the invention to reduce attenuation of ultraviolet light introduced into a photo CVD chamber.

It is another object of the invention to provide an improvement that aids in cleaning of deposits from walls of a photo CVD reaction chamber.

It is another object of the invention to provide improved uniformity of the deposited film thickness in a photo CVD process by individually controlling the intensity of light over the entire surface of the substrate on which the film is deposited.

It is another object of the invention to avoid degradation of the light intensity in a photo CVD process as a result of large window thickness.

It is another object of the invention to avoid the expense of using synthetic quartz windows in a window of a photo CVD chamber.

It is another object of the invention to avoid limitations on the size of a photo CVD chamber due to limitations on the thickness and size of chamber windows that can, as a practical matter, be used.

Briefly described, and in accordance with one embodiment thereof, the invention provides a photo-assisted chemical vapor deposition system including a reaction chamber, a susceptor in the reaction chamber supporting a wafer, a source for introducing reactant gas into the reaction chamber through an inlet port and a cover positioned in sealed relationship to the housing and partially bounding the reaction chamber, the cover including a plurality of elongated light pipe openings each having a length greater than the diameter of the pipe and each of a plurality of transparent surfaces which are disposed in sealed relationship with the cover and bound an outer end of each of the light pipe openings, respectively. In one embodiment of the invention, the transparent surfaces are glass bulb covers of individual ultraviolet lamps each containing an internal ultraviolet emitting element. Ultraviolet light through the various transparent surfaces is introduced into the reaction chamber. The light pipes and purging gas introduced within the light pipes adjacent to the bases of the ultraviolet lamps prevent reactant molecules in the reaction gas from reaching the transparent surfaces and being deposited thereon. In one embodiment, the intensities of ultraviolet light entering the reaction chamber through the various transparent surfaces are individually controlled so as to effectuate uniform deposition of reactant molecules from the reactant gas onto the wafers. The intensity of ultraviolet light admitted through the transparent surface into the reaction chamber is increased in accordance with increasing distance of the light pipe openings from the reactant gas inlet port, such that increased intensity of ultraviolet light in the reaction chamber compensates for depletion of reaction molecules in the reactant gas as it flows across the wafer. The diameters of the light pipe openings are sufficiently small to maintain one-dimensional purge gas flow so that reactant gas diffuses against the purge gas flow to reach the transparent surfaces. The cover is composed of conductive metal. rf power is applied to the cover to cause it to function as a plasma electrode. Plasma is produced from gas introduced into the reaction chamber to effectuate plasma cleaning of the interior of the reaction chamber and the light pipe openings.

DETAILED DESCRIPTION OF THE PREFERRED EMBODIMENTS

Figure 1:
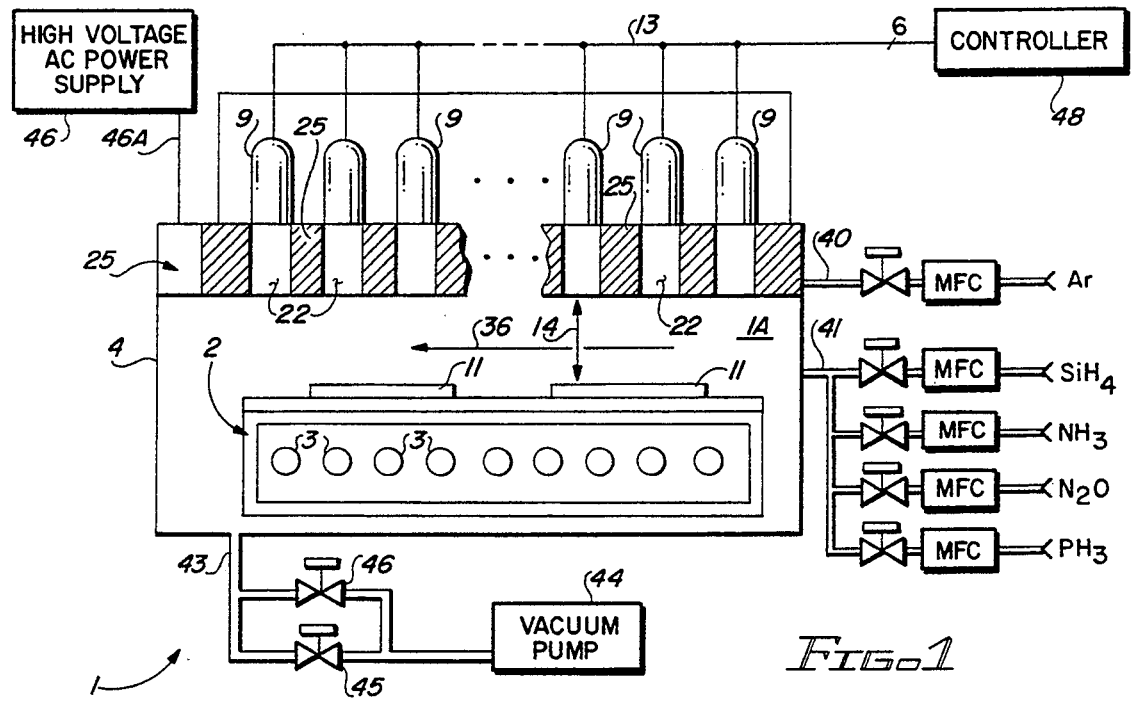
FIG. 1 is a schematic diagram of the photo CVD apparatus of the present invention.
Figure 1A:
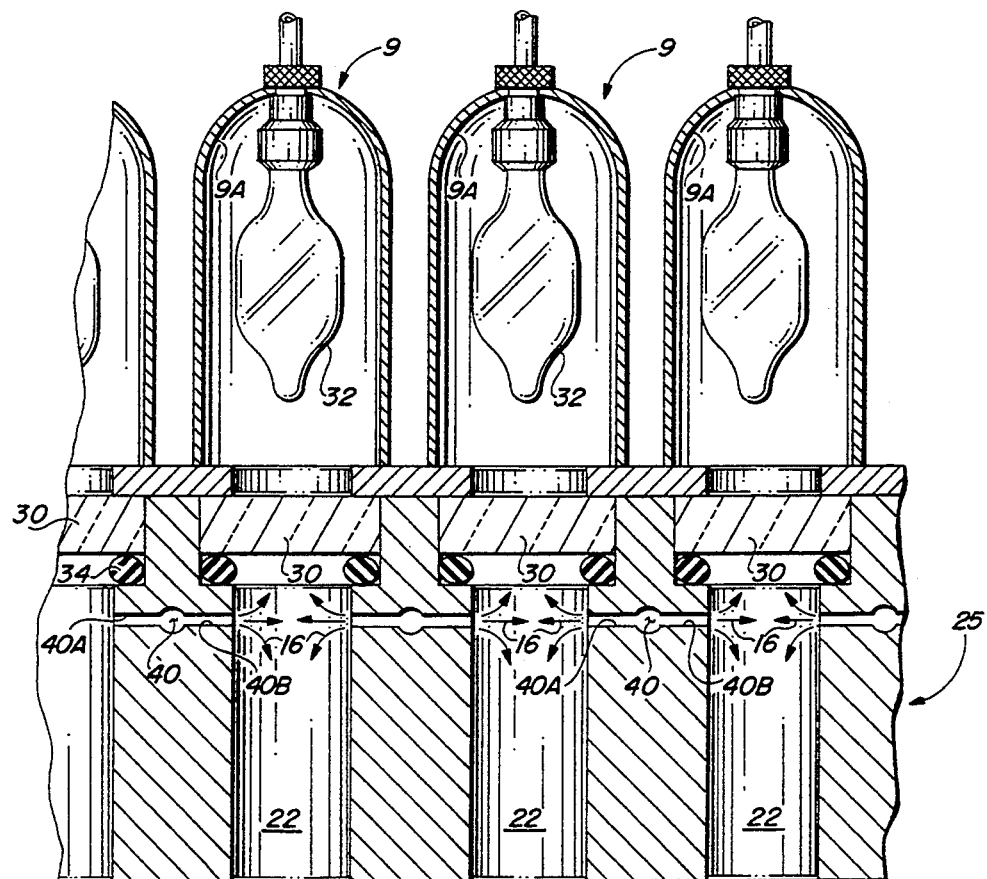
FIG. 1A is an enlarged partial view of a portion of the apparatus shown in FIG. 1.
Figure 2:
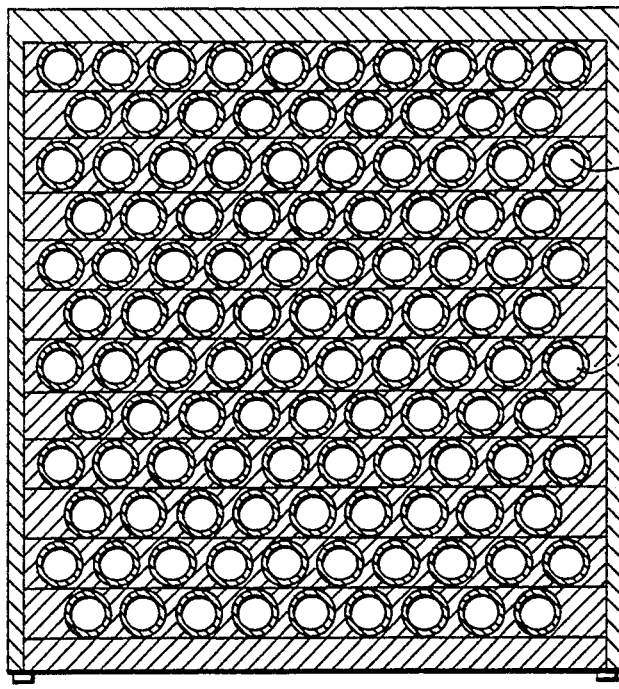
FIG. 2 is a plan view of a panel supporting multiple UV lamps in the embodiment of the invention shown in FIG. 1.

Referring now to the drawings, particularly FIGS. 1, 1A, and 2, photo CVD system 1 includes a reaction chamber 1A bounded by a wall 4. A susceptor 2 supports four six to eight inch semiconductor wafers 11 on a top surface thereof. Susceptor 2 is heated, typically to a temperature in the range from about 150 to 400 degrees Centigrade, by means of heating lamps 3 beneath or within susceptor 2. For six inch wafers, the reaction chamber 1A can be approximately 18 inches long by 16 inches wide by 9 inches deep. The distance 14 between wafers 11 and the bottom of a light admitting cover 25 can be in the range from about 5 to 10 centimeters.

Cover 25 is composed of stainless steel, is approximately 6 centimeters thick, and contains an array of approximately 200 elongated cylindrical, vertical openings or light pipes 22 through which UV light is admitted into reaction chamber 1A. The diameter of each of the light pipes 22 can be approximately 1.5 centimeters.

In FIG. 1A, a separate UV lamp housing 9 is located over the top surface of cover 25 over each light pipe 22. All of the UV light being generated by a UV lamp 32 within each housing 9 is transmitted downward through the corresponding light pipe 22 into reaction chamber 1A. As shown better in FIG. 1A, the interior surface of each UV lamp housing 9 contains a mirrored surface 9A from which the UV light emitted from the UV lamp 32 is reflected downward. The inside surface of each of the light pipes 22 is mirrored.

The UV lamps 32 can be individually controlled, or they can be controlled in groups by a controller 48 (FIG. 1) in accordance with an empirically determined program to provide optimum uniformity of the deposition of material from the reactant gas onto the surfaces of wafers 11. Numeral 13 in FIG. 1 designates the control lines or power lines connected to the various UV lamps 32.

A plurality of thin, circular transparent window disks 30, sealed by suitable O-rings 34, are disposed at the upper edge of each light pipe 22, so that UV light from each UV emitting element 32 passes downward through each of the window disks 30 and through the corresponding light pipe 22 into reaction chamber 1A. As shown in FIGS. 1 and 1A, a tube 40 carries inert argon purging gas supplied from an external source through a suitable mass flow controller (MFC) and a control valve and is introduced into a passage in cover 25. The passage includes subpassages or branches 40A and 40B in each light pipe 22 as shown in FIG. 1A, radially distributing inert argon gas as indicated by arrows 16, to purge each of the light pipes 22 causing reactant gases to diffuse against the purge gas flow in order to reach the window surface.

Reactant gases from one or more of a number of external gas sources, such as $SiH_4$ (silane), $Si_2H_6$ (disilane), $NH_3$ (ammonia), $N_2O$ (nitrous oxide), and $PH_3$ (phosphine) are controlled by corresponding mass flow controllers and pass through manifold 41 and pass into and through reaction chamber 1A, across the surfaces of wafers 11, and are exhausted through exhaust passage 43. In accordance with good practice, a vacuum pump 44 is initially utilized to slowly evacuate reaction chamber 1A through a "sub-gate" valve 46 until the reaction chamber pressure reaches approximately 10 torr, so as to not distribute minute particulates inside chamber due to turbulence that might be caused by faster pumping. Then gate valve 45 is opened and sub-gate valve 46 is closed to effectuate suitable flow of inert argon purging gas and reactant gases out of reaction chamber 1A.

Since entire cover 25 is composed of metal such as stainless steel, it is an electrical conductor. rf power of approximately 500 watts at a frequency of 13.56 MHz can be applied to cover 25 to cause it to generate plasma during cleaning of reaction chamber 1A using $NF_3$ gas.

Figure 5:
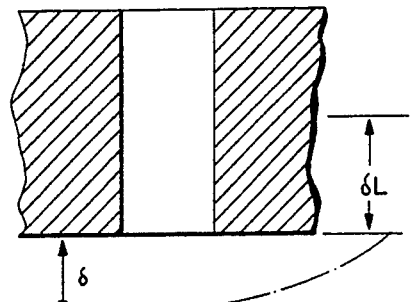
FIG. 5 is another diagram useful in explaining the proposed theory of operation of the invention.
Figure 4:
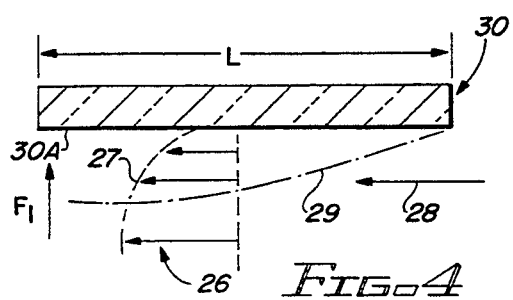
FIG. 4 is a diagram useful in explaining a proposed theory of operation of the invention.

The window deposition can be explained by first considering the mechanism for deposition on the window surface without light pipes present. In FIG. 4, the light admitting window 30 of length L bounds a reactant region in which reactant gas flow is from right to left, as indicated by the arrow 28. Curve 27 designates the configuration of the velocity profile of boundary layer of reactant gas, which has an average thickness of $\delta$, as indicated in FIG. 5. Curve 29 represents an edge of a boundary layer of reactant gas flow along window surface 30A. The lengths of arrows 26 indicate the velocities of different parts or layers of the boundary layer 29 at various distances from the bottom surface of light admitting window 30. The "flux" of reactant gas molecules from the bulk of the flowing reactant gas to the inner surface 30A of the window is given by the equation $$F_1 = h_g(C_g - C_s), \quad (1)$$

where $F_1$ is the flux or flow rate of reactant gas molecules toward light admitting window 30, $h_g$ is the gas phase mass-transfer coefficient, $C_g$ is the reactant concentration in the bulk of the reactant gas, and $C_s$ is the reactant concentration at the surface 30A of light admitting window 30.

The flux $F_2$ corresponding to the consumption of the reactant gas is given by the equation $$F_2 = k_s C_s, \quad (2)$$

where $k_s$ is a chemical surface reaction rate constant.

Under steady state conditions, $F_1$ is equal to $F_2$, so $$C_s = \frac{C_g}{1 + k_s/h_g}, \text{ and} \quad (3)$$

the growth rate V is given by $$V = \frac{F}{N1}, \quad (4)$$

where $F_1$ and $F_2$ are equal to F, and N1 is equal to the number of atoms incorporated into a unit volume of the film of reactant gas molecules deposited on surface 3A.

Therefore, $$V = \frac{F}{N1} = \frac{k_s \cdot h_g}{k_s + h_g} \times \frac{C_g}{N1} = \frac{k_s \cdot h_g}{k_s + h_g} \times \frac{C_T \cdot Y}{N1}, \quad (5)$$

where $C_g$ is equal to $C_T-Y$,
where $C_T$ is the total number of molecules per cubic centimeter in the reactant gas and Y is the mole fraction of reactant gas species.

According to well known boundary layer theory, the mass transfer of the reactant species across the boundary layer proceeds by diffusion. Therefore, $$h_g = \frac{D_g}{\delta} \quad (6)$$

where $D_g$ is the diffusion coefficient of the reactant gas, and $\delta$ is the average boundary layer thickness.

For the present invention, the elongated window pipes 22 provide an additional stagnant layer of reactant gas through which the reactant species of the reactant gas must diffuse. In this case, the mass transfer coefficient $h_g$ can be modified as follows:

$$h_g = \frac{D_g}{\delta + \delta L}, \quad (7)$$

as can be ascertained from FIG. 5, which shows the boundary layer 29 of average thickness $\delta$ along the lower edge of the light pipes, which have a length $\delta L$.

Therefore, the reactant concentration at the surface of the window is $$C_s = \frac{D_g \cdot C_g}{D_g + k_s(\delta + \delta L)} \quad (8)$$

if $C_{so}$ is the value of $C_s$, in FIG. 4 without use of light pipes (so that $\delta L$ is equal to zero), and $C_{SL}$ is the value of $C_S$ with the window pipes of length $\delta L$. The ratio between $C_{SL}$ and $C_{SO}$ then is given by the equation $$R_{CS} = \frac{C_{SL}}{C_{SO}} = \frac{D_g + k_s \cdot \delta}{D_g + k_s(\delta + \delta L)}, \quad (9)$$

and the growth rate of reactant species deposited on the surface of the window is $$V = \frac{k_s h_g}{k_s + h_g} \times \frac{C_T \cdot Y}{N1} = \frac{k_s \cdot D_g}{D_g + k_s \cdot (\delta + \delta L)} \times \frac{C_T Y}{N1} \quad (10)$$

The ratio of the deposition rate on the surface 30A with light pipes 20 present to the deposition rate without light pipes 20 therefore is given by $$R_V = \frac{V_L}{V_O} = \frac{D_g + k_s \delta}{D_g + k_s(\delta + \delta L)} \quad (11)$$

Therefore, $R_V$ decreases as $\delta_L$ increases. This ratio depends on process conditions such as process pressure, introduced light intensity, reactant gas flow rate, etc.

Figure 6:
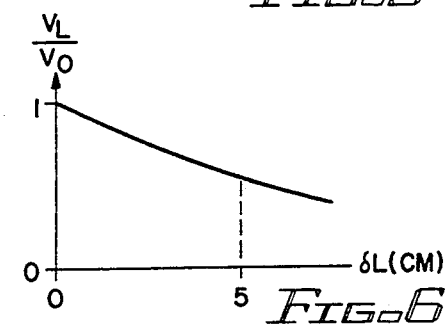
FIG. 6 is a graph showing normalized deposition rate versus length of a light pipe without purging gas.

FIG. 6 shows the deposition rate ratio as a function of a length $\delta L$ of the light pipes.

Under normal process conditions, it is not sufficient to avoid the window deposition. My simulations indicate that the ratio $V_L/V_O$ lies in the range of 0.8 to 0.95 under various process conditions.

Another function of light pipes 20 in the described photo CVD window assembly is to direct a "one-dimensional" inert gas flow inside the pipes to prevent the reactant species from reaching the window surface 30A whereat the deposition reaction causes the above-mentioned fogging problem.

Since the characteristic dimensions of the pipe opening are much larger than the free path of the reactant molecules. This is a viscous flow and the situation can be modeled as a diffusion of reactant molecules, with the drift or convection term representing drift of reactant molecules in the direction opposite to the direction of the diffusion.

$$F = -D\frac{\partial C}{\partial x} - VC \quad (12)$$

where F is the flux of reactant molecules, D is the diffusion constant, V is the velocity, and C is the concentration of the reactant molecules.

The flux of the reactant molecules is given by $$\frac{\partial C}{\partial t} = -\frac{\partial F}{\partial x} = D\frac{\partial^2 C}{\partial x^2} + V\frac{\partial C}{\partial x}. \quad (13)$$

It is necessary to solve the diffusion equation subject to the appropriate boundary conditions. After following procedures to solve the partial differential equations, the following solution is obtained:

$$C(x,t) = \frac{C_o}{2}\left[ erfc\left(\frac{x + Vt}{2\sqrt{Dt}}\right) + \right. \quad (14)$$

$$e^{-\frac{V \cdot x}{D}} erfc\left(\frac{x - Vt}{2\sqrt{Dt}}\right) +$$

$$\sum_{n=1}^{\infty}\left\{ e^{\frac{nVL}{D}} erfc\left(\frac{x + 2nL + Vt}{2\sqrt{Dt}}\right) + \right.$$

$$e^{-\frac{V(x+nL)}{D}} erfc\left(\frac{x + 2nL - Vt}{2\sqrt{Dt}}\right) -$$

$$e^{-\frac{nVL}{D}} erfc\left(-\frac{x - 2nL + Vt}{2\sqrt{Dt}}\right) -$$

$$\left.\left. e^{-\frac{V(x-nL)}{D}} erfc\left(-\frac{x - 2nL - Vt}{2\sqrt{Dt}}\right) \right\}\right].$$

C(x,t) being the concentration of reactant molecules as a function of distance x from the open end of the light pipe, t being the time, and erfc being the complementary error function.

Further reduction of the above equation leads to $$C(x,t) = C_o \sum_{n=1}^{\infty} \left[ e^{-\frac{nVL}{D}} + e^{\frac{Vx-nVL}{D}} \right] + \quad (15)$$

$$\frac{C_o}{2} \sum_{n=-\infty}^{\infty} \left[ e^{-\frac{nVL}{D}} \, \text{erfc}\left( \frac{x+2nL+Vt}{2\sqrt{Dt}} \right) + \right.$$

$$\left. e^{-\frac{Vx+nVL}{D}} \, \text{erfc}\left( \frac{x+2nL-Vt}{2\sqrt{Dt}} \right) \right]$$

The reaction flux is expressed as:

$$F(x,t) = VC_o \sum_{n=1}^{\infty} e^{-\frac{nVL}{D}} + \quad (16)$$

$$\frac{C_o}{2} \sum_{n=-\infty}^{\infty} \left[ \sqrt{\frac{D}{\pi t}} \left\{ e^{-\frac{nVL}{D}} e^{-(\frac{x+2nL+Vt}{2\sqrt{Dt}})^2} + \right. \right.$$

$$\left. e^{-\frac{Vx+nVL}{D}} e^{-(\frac{x+2nL-Vt}{2\sqrt{Dt}})^2} \right\} -$$

$$\left. V e^{\frac{nVL}{D}} \, \text{erfc}\left( \frac{x+2nL+Vt}{2\sqrt{Dt}} \right) \right].$$

Figure 7:
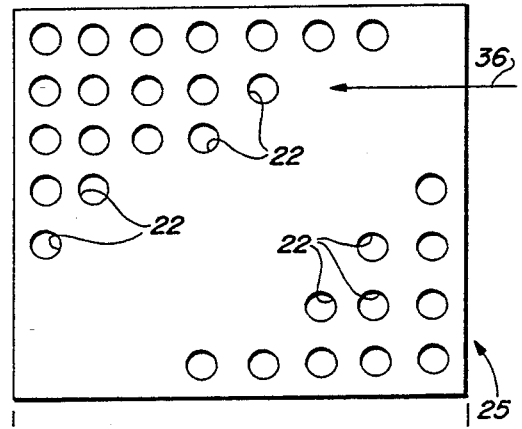
FIG. 7 is a graph illustrating the effects on window deposition of reactant species when inner purging gas is introduced into the light pipes.
Figure 7:
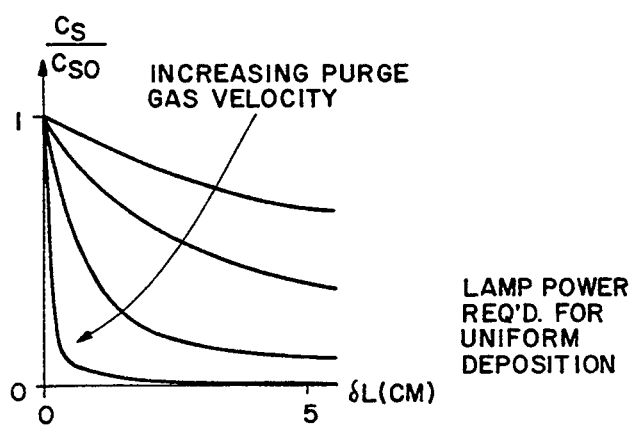

By controlling the velocity of inert gas flow, the concentration of the reactant gas near the window surface 30A can be minimized. The graph of FIG. 7 shows how the concentration of the reactant gas, normalized to the concentration of the reactant gas without using light pipes 22, plotted versus distance in the direction into the light pipe from the open end of a light pipe 22 as a function of the flow velocity of the inert purge gas. FIG. 7 shows that at a given inert gas flow velocity out of the light pipes 22, the reactant gas concentration is drastically reduced at points of increasing distance from the mouth of light pipe 22 toward window surface 30A. This results in greatly reduced deposition of the reactant species on the window surface 30A and thereby avoids the above-described problems of prior photo CVD systems. By setting the velocity of the inert gas at approximately 50 centimeters per second and setting the light pipe length at approximately 5 centimeters, window deposition can be reduced to less than $10^{-3}$ times the window deposition that occurs if the light pipes 22 and the inert purging gas therein are not used according to the present invention.

Figure 3:
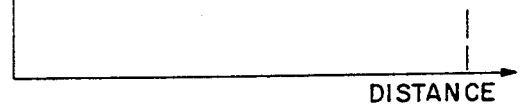
FIG. 3 is a diagram useful in describing control of UV light intensity into a photo CVD reaction chamber to compensate for depletion of reactant species from reactant gas flowing across semiconductor wafers in the reaction chamber.

As shown in FIG. 3, which includes a graph of the intensity of light emitted by the various UV lamps 32 into reaction chamber 1A, the amount of power applied to the UV lamps 32 can be increased with distance from right to left through reaction chamber 1A under cover 25 in the direction of reactant gas flow 36 to compensate for depletion of reactant gas molecules as they are deposited on the surfaces of semiconductor wafers 11. Providing individual UV lamps 32 allows such control. Controller 48 (FIG. 1) is programmed to achieve very uniform deposition rates on semiconductor wafers 11, improving the yield of integrated circuits being manufactured.

To summarize, in accordance with the present invention, narrow individual light pipes 22 have been used to introduce UV light into photo CVD reaction chamber 1A so that reactant gas molecules must diffuse through a layer of stagnant gas the thickness of which is equal to the length of pipe 22 before the reactant gas molecules can be deposited on surface 30A of the light admitting window 30.

If inert purging gas flows through passages 40, 40A, and 40B near the top ends of light pipes 22, causing one-dimensional flow of the inert purging gas in the direction opposite to that of the diffusing reactant gas molecules, then their deposition on window surface 30A is further reduced by reducing the concentration of reactant gas near window surface 30A. Clouding of transparent surfaces 30 should thereby be avoided or greatly reduced.

Use of individually controlled UV lamps 32 by controller 48 allows the intensity of introduced UV light into photo CVD reaction chamber 1 to be controlled as indicated by curve 53 of FIG. 3 so as to compensate for depletion of reactant gas molecules as the reactant gas flows across the wafers 11. Very uniform deposition of reactant gas molecules across very large semiconductor wafer areas within reaction chamber 1A is thereby achieved. Since the diameter of each of the synthetic quartz windows is only approximately 1.65 centimeters, the light admitting window 22 can be much thinner than the much larger light admitting windows of prior photo CVD reaction chambers and nevertheless have sufficient strength to allow evacuation of reaction chamber 1A by vacuum pump 44 without risk of window breakage.

Since cover 25 is composed of metal, it is used as a plasma electrode to effectuate easy maintenance of the system without designing a plasma electrode located between window surface 30A and the wafer or substrate, which would tend to introduce non-uniformities into the light illumination.

Figure 8:
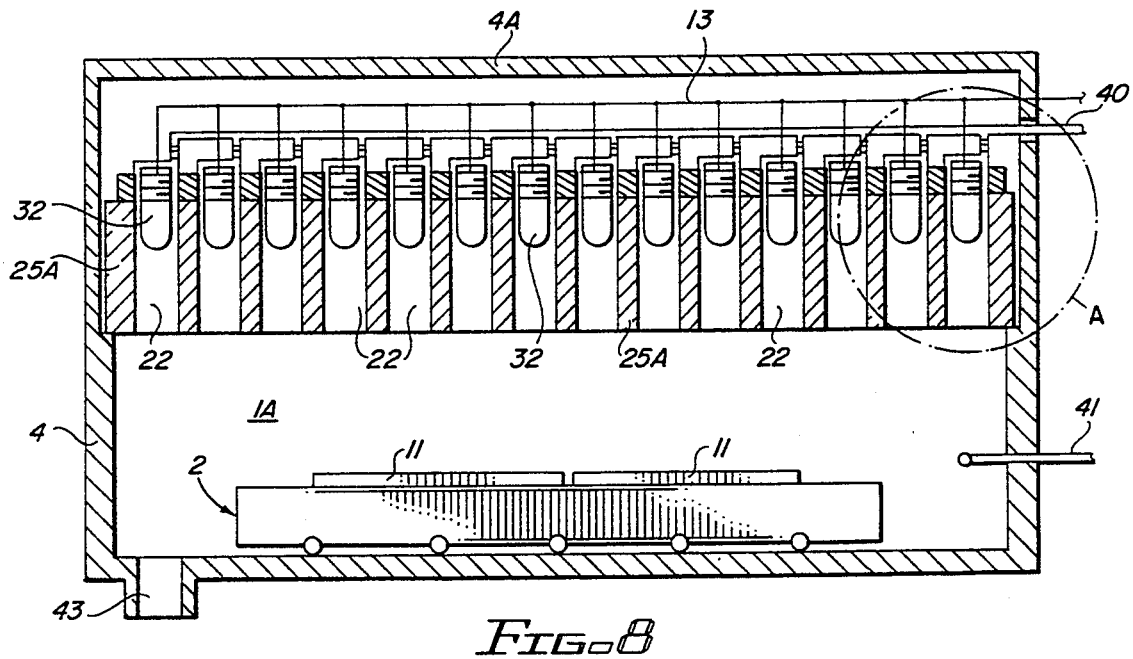
FIG. 8 is schematic diagram of a photo CVD apparatus of an alternate embodiment of the invention, in which the window disks 30 of FIG. 1A are omitted.
Figure 9:
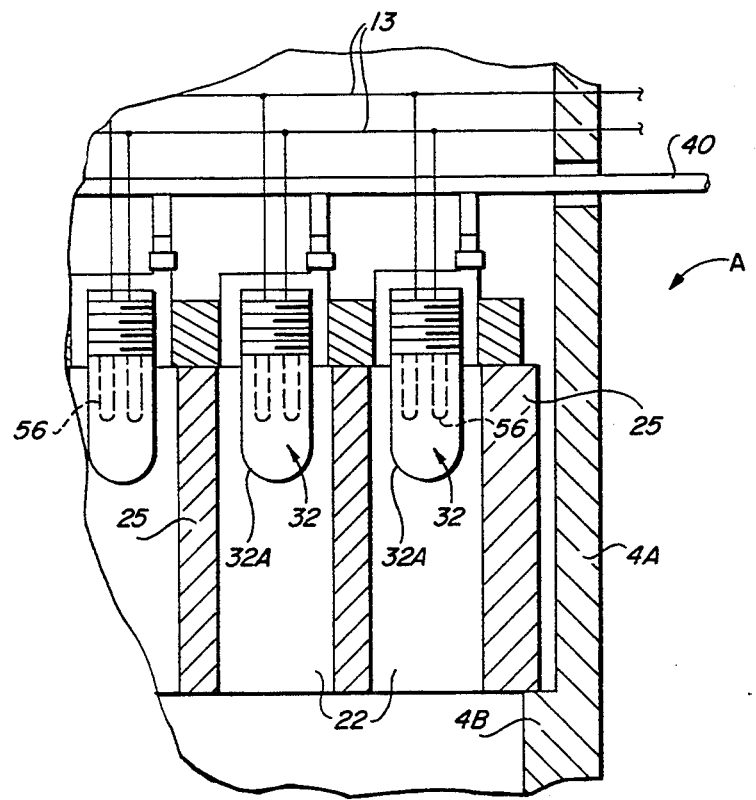
FIG. 9 is an enlarged view of detail A of FIG. 8.

Referring to FIGS. 8 and 9, it should be noted that the glass covers or glass bulbs of UV lamps 32 can perform the same function as transparent window disks 30, i.e., the function of allowing UV light to pass from the internal UV emitting elements 56 of lamps 32 into reaction chamber 1A. Therefore, the window disks 30 of FIGS. 1 and 1A can be omitted in some cases, if appropriate seals are provided between the UV lamps and reaction chamber 4 and chamber cover 4A so that a vacuum can be maintained in reaction chamber 1A and the lamps are located in the vacuum.

FIGS. 8 and 9 show an embodiment of the invention in which the above described window disks are omitted, and the chamber cover 4A are sealed relative to chamber wall 4 to maintain the vacuum in reaction chamber 1A and the UV lamps 32 are located in the vacuum. In FIGS. 8 and 9, the same reference numerals are used as in FIGS. 1 and 1A to designate corresponding parts, where appropriate. Since the window disks are omitted as in FIGS. 8 and 9, the above mentioned purging gas can be introduced into the light pipes 22 near the bases of the various UV lamps 32, rather than below the window disks 30 as shown in FIG. 1A. In FIG. 9, the internal emitting elements of UV lamps 32 are designated by dotted lines 56, and the glass bulbs which perform the function of the omitted window disks are designated by numerals 32A. In FIG. 8, the reaction chamber housing 4 surrounds reaction chamber cover 25A. Housing 4 extends upward over internal reaction chamber cover 25A, as indicated by 4A. Purge gas pipe 40 extends through the wall of housing 4 above internal cover 25A and injects purging gas at the bases of UV lamps 32, rather than extending through the walls 20 between light pipes 22 as shown in the embodiment of FIG. 1A.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention. The light pipes can be of any suitable shape, and need not be cylindrical. Hexagonal or square cross-sectional shapes of the light pipes can reduce the required wall thickness between adjacent light pipes, leading to greated density of UV light sources illuminating the wafers.

What is claimed is:

1. A method of preventing deposition of material from a reactant gas onto a plurality of spaced transparent surfaces admitting an ultraviolet light into a photoassisted chemical vapor deposition reaction chamber, comprising the steps of:

(a) introducing the reactant gas into the reaction chamber upstream from a substrate supported in the reaction chamber; and (b) introducing the ultraviolet light into the reaction chamber through the plurality of spaced transparent surfaces located between a plurality of ultraviolet light emitting elements and a plurality of elongated light pipe passages in a sealed wall bounding the reaction chamber, the plurality of ultraviolet light emitting elements being located in alignment with the elongated light pipe passages, respectively, the transparent surfaces each including a glass bulb of a separate ultraviolet light source containing one of the ultraviolet light emitting elements, whereby reactant molecules of the reactant gas fail to reach and be deposited on the transparent surfaces.

2. The method of claim 1 including the step of introducing an inert gas into a portion of each of the elongated light pipe passages adjacent to a base of each of the ultraviolet light sources, thereby retarding diffusion of the reactant molecules through the elongated light pipe passages toward the corresponding transparent surfaces.

* * * * *